United States Patent [19]
Dhar et al.

[11] Patent Number: 6,124,076
[45] Date of Patent: Sep. 26, 2000

[54] MATERIAL EXHIBITING COMPENSATION FOR POLYMERIZATION-INDUCED SHRINKAGE AND RECORDING MEDIUM FORMED THEREFROM

[75] Inventors: Lisa Dhar, New Providence; Howard Edan Katz, Summit, both of N.J.

[73] Assignee: Lucent Technologies Inc., Murray Hill, N.J.

[21] Appl. No.: 09/108,496

[22] Filed: Jul. 1, 1998

[51] Int. Cl.$^7$ .................................................. G03C 1/73
[52] U.S. Cl. ................... 430/281.1; 430/290; 430/280.1
[58] Field of Search ........................... 430/280.1, 281.1, 430/290.1, 290.2

[56] References Cited

U.S. PATENT DOCUMENTS

| | | | |
|---|---|---|---|
| 5,279,689 | 1/1994 | Shvartsman | 156/220 |
| 5,525,645 | 6/1996 | Ohkawa et al. | 522/74 |
| 5,575,878 | 11/1996 | Cox et al. | 156/247 |
| 5,710,234 | 1/1998 | Fujishiro et al. | 528/106 |
| 5,759,721 | 6/1998 | Dhal et al. | 430/280.1 |
| 5,869,210 | 1/1999 | Ohkuma et al. | 430/330 |

FOREIGN PATENT DOCUMENTS

| | | |
|---|---|---|
| 0 139 234 D2 | 9/1984 | European Pat. Off. . |
| 02116537A | 5/1990 | Japan . |
| 09-268205 | 10/1997 | Japan . |
| 04/09050 | 4/1994 | WIPO . |
| WO 97/44714 | 11/1997 | WIPO . |

OTHER PUBLICATIONS

Shvartsman, "Replication of diffractive optics", Critical reviews of optical science and technology, vol. CR49, pp. 165–186, 1993.
Translation of wo/94/09050, Apr. 1994.
Translation of jp 09–268205, Oct. 1997.
Crivello, J.V., et al., Alkoxy–substituted diaryliodonium salt cationic photoinitiators, J. Polymer Sci., vol. 27A(12), pp. 3951–3969, Nov. 1989.
Sadhir, Ph.D., Rajender K. et al., "Expanding Monomers: Synthesis, Characterization, and Applications", CRC Press, pps. 2–25.
Bernstein, Bruce S., "Electrical and Electronic Properties of Expanding Polymers", 1992, pps. 237–261.
Takata, Toshikazu et al., "Recent Advances in the Development of Expanding Monomers: Synthesis, Polymerization and Volume Change", *Prog. Polym. Sci.,* vol. 18, 1993 Pergamon Press Ltd., pp. 839–859.
Fouassier, J. et al., "Photopolymers for Laser Imaging and Holographic Recording: Design and Reactivity of Photosensitizers", *Optical Engineering,* vol. 35, No. 1, Jan. 1996, pps. 304–313.
Waldman, D. A. et al., "Volume Shrinkage in Slant Fringe Gratings of a Cationic Ring–Opening Holographic Recording Material", *J. of Imaging Science and Technology,* vol. 41, No. 5, Sep./Oct. 1997, pp. 497–514.
Bolln, Carsten et al., "Synthesis and Photoinitiated Cationic Polymerization of 2–Methylene–7–phenyl–1,4,6,9–tetraoxaspiro[4.4]nonane", *Macromolecules* 1996, 29, 3111–3116.

(List continued on next page.)

*Primary Examiner*—Martin Angebranndt
*Attorney, Agent, or Firm*—Scott J. Rittman

[57] ABSTRACT

The invention relates to use of a material containing a polymerizable monomer or oligomer, the material exhibiting desirable shrinkage compensation upon polymerization. The material contains an expansion agent having a cleaving moiety with the capacity to be cleaved or fragmented by a catalytic reaction, e.g., acid catalysis. The cleavage, by increasing the number of molecules in the material, causes expansion that compensates, at least in part, for shrinkage induced by polymerization of the monomer or oligomer. The expansion agent is capable of providing compensation such that no more than 0.4%, advantageously no more than 0.2%, volume shrinkage per molar concentration of polymerized monomer functional groups occurs, where such compensation is performed at relatively low temperatures of less than 40° C.

18 Claims, 1 Drawing Sheet

OTHER PUBLICATIONS

Waldman, D. A. et al, "Cationic Ring–Opening Photopolymerization Methods for Volume Hologram Recording", *SPIE* vol. 2689, pp. 127–141.

Zhao, C. et al., Shrinkage–Corrected Volume Holograms Based on Photopolymeric Phase Media for Surface–Normal Optical Interconnects, *Applied Phys. Letter*, 71 (11). Sep. 15, 1997, pp. 1464–1466.

Manzhen, M. A. "Photoinitiated Cationic Copolymerization of an Alicyclic Epoxy Compound and a Spiroorthocarbonate", *Intern. J. Polymeric Mater.*, 1992, vol. 18, pp. 1–7.

Frechet, J. M. J. et al., "Photogenerated Base in Resist and Imaging Materials: Design of Functional Polymers Susceptible to Base Catalyzed Decarboxylation", *Chem. Mater.*, 1997, 9, pp. 2887–2893.

Urankar, E. J. et al., "Photogenerated Base in Polymer Curing and Imaging: Cross–Linking of Base–Sensitive Polymers Containing Enolizable Pendant Groups", *Chem. Mater.*, 1997, 9, pp. 2861–2868.

Boothe, T. E. et al., "Stereochemistry of Free–Radical Eliminations on β–Phenylsulfonyl Radicals", *J. Org. Chem.*, 1980, 45, pp. 794–797.

Keeffe, J. R. et al., "Elimination Reactions of N–(2–(p–Nitrophenyl)ethyl)alkylammomium Ions by an ElcB Mechanism", *J. Am. Chem. Soc.*, 1983, 105, pp. 265–279.

Hilbert, J. M. et al., "Base–Catalyzed β–Elimination Reactions. 7. Elimination from 4–(Para–substituted–phenoxy)–2–oxobutanoic Acids", *J. Org. Chem.*, vol. 43, No. 3, 1978, pp.452–459.

Ishida, Hatsuo, "Physical and Mechanical Characterization of Near–Zero Shrinkage Polybenzoxazines", *J. of Polymer Science: Part B: Polymer Physics*, vol. 34, 1996, pp. 1019–1030.

Piggott, M. R. et al., Shrinkage Control in Fibre Reinforced Polymers II: Epoxy Resins With Expanding Monomers, *Polymers & Polymer Composites*, vol. 3, No. 5, 1995, pp. 361–368.

MATERIAL EXHIBITING COMPENSATION FOR POLYMERIZATION-INDUCED SHRINKAGE AND RECORDING MEDIUM FORMED THEREFROM

BACKGROUND OF THE INVENTION

1. Field of the Invention

The invention relates to monomeric or oligomeric materials in which polymerization-induced shrinkage is desirably avoided. In particular, the invention relates to holographic recording media formed from such materials.

2. Discussion of the Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of a representation, e.g., a page, of data. Typically, recording light passes through a two-dimensional array of dark and transparent areas representing data, and the holographic system stores, in three dimensions, holographic representations of the pages as patterns of varying refractive index in a storage medium. Holographic systems are discussed generally in D. Psaltis et al., "Holographic Memories," *Scientific American*, November 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference. In one embodiment of phase correlation multiplex holography, a reference light beam is passed through a phase mask, and intersected in the recording medium with a signal beam that has passed through an array representing data, thereby forming a hologram in the medium. The spatial relation of the phase mask and the reference beam is adjusted for each successive page of data, thereby modulating the phase of the reference beam and allowing the data to be stored at overlapping areas in the medium. The data is later reconstructed by passing a reference beam through the original storage location with the same phase modulation used during data storage.

FIG. 1 illustrates the basic components of a holographic system 10. System 10 contains a modulating device 12, a photorecording medium 14, and a sensor 16. Modulating device 12 is any device capable of optically representing data in two-dimensions. Device 12 is typically a spatial light modulator that is attached to an encoding unit which encodes data onto the modulator. Based on the encoding, device 12 selectively passes or blocks portions of a signal beam 20 passing through device 12. In this manner, beam 20 is encoded with a data image. The image is stored by interfering the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location and/or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in the medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase (depending on the multiplexing scheme used) at which reference beam 22 was directed during storage of the data. The reconstructed data passes through lens 34 and is detected by sensor 16. Sensor 16 is, for example, a charged coupled device or an active pixel sensor. Sensor 16 typically is attached to a unit that decodes the data.

The capabilities of such holographic storage systems are limited in part by the storage media. Iron-doped lithium niobate has been used as a storage medium for research purposes for many years. However, lithium niobate is expensive, is relatively poor in sensitivity (1 J/cm$^2$), has relatively low index contrast ($\Delta n$ of about $10^{-4}$), and exhibits destructive read-out (i.e., images are destroyed upon reading). Alternatives have therefore been sought, particularly in the area of photosensitive polymer films. See, e.g., W. K. Smothers et al., "Photopolymers for Holography," SPIE OE/Laser Conference, 1212-03, Los Angeles, Calif., 1990. The material described in this article contains a photoimageable material system containing a liquid monomer material (the photoactive monomer) and a photoinitiator (which promotes the polymerization of the monomer upon exposure to light), where the photoimageable material system is located within an organic polymer host matrix that is substantially inert to the exposure light. During writing of information into the material by exposure to radiation in selected areas, the monomer polymerizes in the exposed regions. Due to the lowering of the monomer concentration caused by induced polymerization, monomer from the dark, unexposed regions of the material diffuses to the exposed regions. The polymerization and resulting concentration gradient create a refractive index change, forming the hologram representing the data.

Most holographic systems of this type are based on photopolymerization of free-radical photosensitive monomers such as acrylate esters. See, for example, U.S. patent application Ser. No. 08/698,142 (our reference Colvin-Harris-Katz-Schilling 1-2-16-10), the disclosure of which is hereby incorporated by reference. A variety of such photosensitive monomers are commercially available. While media based on such monomers provide useful results, it is possible for such media to encounter several limitations. One typical problem is shrinkage introduced into a recording medium due to the polymerization of the photosensitive monomer. Specifically, because polymerized monomers occupy a smaller volume than individual monomers, each step of writing data into a recording medium introduces localized shrinkage. The combined effect of the localized shrinkage increases the difficulty in accurately retrieving the stored data.

One way to address this shrinkage problem is to adjust the optics of a holographic storage system based on the shrinkage, e.g., rotating the orientation of the medium based on the extent of shrinkage, as discussed in Zhao et al., "Shrinkage-corrected volume holograms based on photopolymeric phase media for surface-normal optical interconnects," *Appl. Phys. Lett.* 71 (11), Sep. 15, 1997, at 1464. Such a method is useful for some types of holographic storage, but is not suitable for data storage applications where images with a well-defined angular bandwidth are recorded.

Some photosensitive monomers were developed which exhibited less shrinkage than conventionally-used acrylate monomers. These monomers not only formed holograms by polymerization (as discussed above), but alsoe exhibited ring-opening during such polymerization. (See, e.g., Waldman et al., "Cationic Ring-Opening Photopolymerization Methods for Volume Hologram Recording," *SPIE* Vol. 2689, 1996, at 127.) Waldman et al. used epoxy polymerization to form holograms, and, because epoxy polymerization involves opening of epoxide monomer rings, the polymerization exhibits about half as much shrinkage as acrylate polymerizations.

It has further been proposed that spiro-orthoesters and spiro-orthocarbonates, so-called expanding monomers, be added to epoxy polymerization systems or employed as the sole polymerizing monomers. (See, e.g., *Expanding Monomers: Synthesis, Characterization, and Applications*, (R. K. Sadhir and R. M Luck, eds., 1992) 1–25, 237–260; T. Takata and T. Endo, "Recent Advances in the Development of Expanding Monomers: Synthesis, Polymerization and Volume Change," *Prog. Polym. Sci.*, Vol. 18, 1993, 839–870.) Such spiro compounds have been reported to exhibit relatively small shrinkage, or even expansion, upon polymerization due to opening of two rings per polymerized monomer functional group. (A monomer functional group is the group or groups on a photoactive monomer that are the reaction sites for polymerization, e.g., during the holographic writing process.) However, the shrinkage compensating ability of the spiro compounds is not as great as has been claimed or desired, primarily because the measured results are due, at least in part, to a phase change. (See C. Bolln et al., "Synthesis and Photoinitiated Cationic Polymerization of 2-methylene-7-phenyl-1,4,6,9-tetraoxaspiro [4,4]nonane," *Macromolecules*, Vol. 29, 1996, 3111–3116.) Specifically, solid forms of the spiro compounds are used in preparing the polymerizable material, and when the solid melts expansion occurs due to the phase change. Also, the rates of ring-opening and accompanying fragmentation side reactions are difficult to tune, and the reactions generally require relatively high temperatures (>40° C.). Thus, the ring-opening chemistries reported to date have not provided a reliable route to holographic media with near-zero dimensional change upon recording.

An improved holographic recording media is therefore desired which exhibits improved compensation for polymerization-induced shrinkage.

SUMMARY OF THE INVENTION

The invention relates to use of a material containing a photoactive monomer, the material exhibiting desirably small volume change upon polymerization. In particular, the material contains an expansion agent having a cleaving moiety with the capacity to be cleaved or fragmented by a catalytic reaction, e.g., acid catalysis. The cleavage, by increasing the number of molecules in the material, causes expansion that compensates, at least in part, for shrinkage induced by polymerization of the monomer. (Cleavage or fragmentation indicates that the product mixture of a reaction contains more non-covalently bonded fragments than were present in the reaction mixture of the reaction. A cleaving moiety is a molecular subunit that becomes detached from a starting material in a cleavage or fragmentation reaction. Subunits that serve to replenish catalysts consumed during the particular steps of a reaction sequence, such as protons, are not considered cleaving moieties based on their replenishing activity. The bond which is broken in the cleavage reaction is the cleaving bond. Monomer, as used herein, also includes photoactive oligomeric compounds.) Advantageously, the expansion agent provides compensation such that no more than 0.4%, more advantageously no more than 0.2%, volume shrinkage per molar concentration (i.e., moles/liter) of polymerized monomer functional groups occurs, where such compensation is possible at relatively low reaction temperatures of less than 40° C. (The percent of volume shrinkage is measured over a temperature range between pre-polymerization and post-polymerization such that dimensional changes due to thermal fluctuations (as measured by, for example, dynamic mechanical analysis) are less than one tenth the dimensional changes due to the chemical reactions.)

The expansion agent typically contains an acid-labile moiety or is itself an acid-labile compound that cleaves by acid catalysis. An acid-labile ester is advantageously employed, from which the cleavage produces a substituted alkene and an acid. Advantageously, both the polymerization and the cleavage are acid catalyzed, in which case a conventional photoacid generator (PAG) is capable of inducing both polymerization and cleavage upon exposure of the article to radiation. (A PAG is a compound that, in response to exposure by radiation, generates an acid. Various PAGs are known in the art of photolithography.) Other expansion agents capable of cleavage, e.g., base catalyzed, are also contemplated.

A recording medium suitable for holography is advantageously formed from the shrinkage-compensated material. The medium contains recording material that includes a polymeric matrix, a photoactive monomer, and the expansion agent. In one embodiment, the polymerization of the monomer occurs by acid catalysis (e.g., epoxy condensation), the expansion agent is an acid-labile ester, and the medium further contains a PAG. During the process of writing a hologram into the medium, the PAG generates an acid, the acid inducing polymerization of the monomer and cleavage of the ester. In such a case, the shrinkage compensation offered by the expansion agent is event matched to the polymerization. (Event matched indicates that cleavage is induced in the illuminated area of the medium during the same time interval in which polymerization is induced, although the cleavage and polymerization need not occur at the same rate. Rate matching, in which the rates of polymerization and cleavage are on the same order of magnitude, is, as discussed below, advantageous.) Using the medium of the invention, it is thereby possible to at least partially compensate for shrinkage occurring during the writing of each individual hologram.

Cleavage of molecules has been discussed previously for holography, but such cleavage has been used in a manner distinct from the invention. (See PCT application WO 97/44714 to Polaroid Corp.) Specifically, instead of polymerizing a monomer to create a refractive index change as in the invention, WO 97/44174 starts with a polymer having high- or low-refractive index moieties, and induces cleavage of the moieties from the polymer to create the refractive index changes. The reference does not discuss either polymerization-induced shrinkage, nor the effect of cleavage in providing any desired expansion. In fact, WO 97/44714 affirmatively seeks to avoid polymerization of photoactive monomers, instead relying solely on cleavage to form a hologram. Polymerization of photoactive monomer, however, offers advantages such as desirable stability of a polymerized final article and relative ease with which monomers are able to diffuse through an (initially) incompletely-polymerized medium to form holograms upon exposure.

The invention therefore provides an article that exhibits a useful method for compensating for polymerization-induced shrinkage, the compensation advantageously event-matched with the polymerization. Use of such event-matching compensation provides a recording medium exhibiting improved holograms capable of being reconstructed with higher fidelity than holograms in previous media.

DETAILED DESCRIPTION OF THE INVENTION

Figure 1:
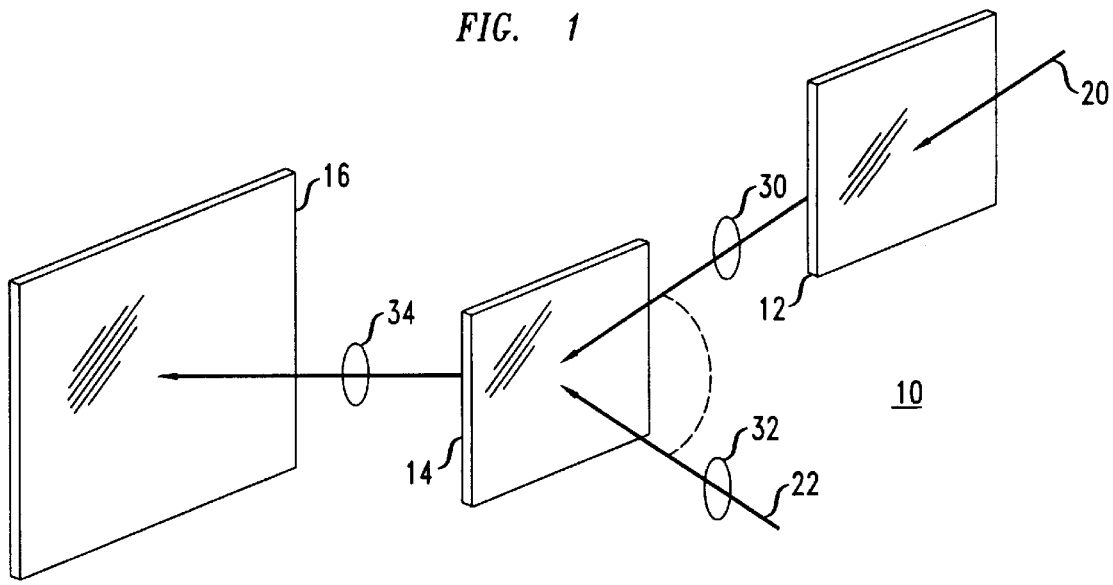
FIG. 1 illustrates a basic holographic storage system.

In one embodiment, the article of the invention is a recording medium suitable for holography. The medium contains recording material that includes a polymeric matrix, a photoactive monomer (or oligomer), an expansion agent, and, generally, a compound that induces cleavage in the expansion agent in response to exposure to radiation. Upon irradiation of the medium to write a hologram, the photoactive monomer, as discussed previously, polymerizes in the exposed portions of the medium, causing shrinkage. Typically, the irradiation of the medium to write a hologram also activates the compound that induces cleavage in the expansion agent. The cleavage causes expansion which provides compensation, at least partially, for such polymerization-induced shrinkage.

The matrix is typically a cross-linked, or other high molecular weight, polymer that acts as a support structure to ensure stable holographic gratings. A suitable matrix will generally provide the recording material with an elastic modulus of at least $10^5$ Pa, generally $10^5$ to $10^9$ Pa. Because the matrix must allow diffusion of the dissolved photoactive monomer, the matrix's glass transition temperature is advantageously between about $-130°$ C. and $80°$ C. In addition, to provide a holographic medium that exhibits relatively low levels of light scatter, the matrix and photoactive monomer, as well as the other components, are advantageously compatible. Polymers are considered to be compatible if a blend of the polymers is characterized, in a 90° light scattering experiment using the wavelength used for hologram formation, by a Rayleigh ratio ($R_{90}°$) less than $7\times10^{-3}$ cm$^{-1}$. The Rayleigh ratio ($R_\theta$) is a conventionally known property, and is defined as the energy scattered by a unit volume in the direction $\theta$, per steradian, when a medium is illuminated with a unit intensity of unpolarized light, as discussed in M. Kerker, *The Scattering of Light and Other Electromagnetic Radiation*, Academic Press, 1969, 38. The Rayleigh ratio is typically obtained by comparison to the energy scatter of a reference material having a known Rayleigh ratio. Polymers which are considered to be miscible, e.g., according to conventional tests such as exhibition of a single glass transition temperature, will typically be compatible as well, but polymers that are compatible will not necessarily be miscible. It is possible to increase compatibility of a matrix with other components, such as monomer, by appending to the matrix groups that resemble such other components, e.g., a functional group from a photoactive monomer, or by appending to the matrix a group that displays a favorable enthalpic interaction, such as hydrogen bonding, with such other components. (It is also possible to make such modifications to various components of a material, to increase the overall compatibility of the individual components.)

The photoactive monomer is a monomer or monomers (or oligomer, as discussed above) capable of undergoing photoinitiated polymerization such that a hologram is formed. It is possible to use cationically polymerizable systems such as vinyl ethers, alkenyl ethers, allene ethers, ketene acetals, and epoxies. Other suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether mixed with maleate and thiol mixed with olefin are also suitable. When the polymerization and the cleavage reactions occur by different classes of catalysts (e.g., acid, base, or free radical), selection of the monomers should take into account the potential interference with the cleavage chemistry. For example, if the monomer decomposes or deactivates the catalyst that promotes the cleavage reaction, it is possible for rate matching, and even event matching, to be difficult due to a slowed cleavage rate.

The medium typically contains a photoinitiator system for inducing polymerization of the photoactive monomer. Direct light-induced polymerization of the photoactive monomer by exposure to light is often difficult, particularly as the thicknesses of recording media increase. The photoinitiator, upon exposure to relatively low levels of the recording light, chemically initiates the polymerization of the monomer, avoiding the need for direct light-induced polymerization of the monomer. It is possible for the photoinitiator to be the same as, or contain, the material that induces cleavage of the expansion agent. For example, in cationically polymerizable systems, as mentioned above, polymerization occurs by acid catalysis, and the photoinitiator system therefore contains a PAG that generates acid in response to exposure to radiation. In such a case, it is advantageous to use an expansion agent that cleaves in response to acid. An acid generated by the PAG is therefore capable of contributing to both polymerization and cleavage.

A variety of PAGs are suitable for inducing polymerization of the photoactive monomer and/or cleavage of acid-labile expansion agents. PAGs are known generally, due to their wide use in photolithography. (See, e.g. J. V. Crivello, "The chemistry of photoacid generating compounds," *Polym. Mater. Sci. Eng.*, Vol. 61, 1989, 62–66, and S. Masamitsu and T. Masahiro, "Photoacid and photobase generators: chemistry and applications to polymeric materials," *Prog. Polym. Sci.*, Vol. 21, No. 1, 1996, 1–45, the disclosures of which are hereby incorporated by reference.) A PAG is capable, or contains a moiety that is capable, of absorbing incident radiation at some wavelength, and, through subsequent chemical transformation, releasing at least one proton, strong proton acid, or Lewis acid. Where a PAG has a low absorbance at a preferred radiation, sensitizers are used. Sensitizers absorb, or contain a moiety that absorbs, the incident radiation at the wavelength of interest, and transfer the energy to the PAG, e.g., by way of Forster transfer, electron transfer, or chemical reaction, thereby inducing reaction of the PAG. (See, e.g., J-P. Fouassier and F. Morlet-Savary, "Photopolymers for laser imaging and holographic recording: design and reactivity of photosensitizers," *Optical Engineering*, Vol. 35, No. 1, 1996, 304–313.) For example, many PAGs respond to ultraviolet (UV) light, whereas visible light (e.g., 480 to 700 nm) is typically used for recording holograms. Thus, sensitizers which absorb at such visible wavelengths are used. Rubrene is one such sensitizer that absorbs at visible wavelengths.

It is possible for a PAG to have a sensitizer moiety, or for the released proton or strong acid to originate on the sensitizer. It is also possible for the PAG and sensitizer to be covalently bonded, which is advantageous in that it would not be necessary for the PAG and sensitizer to diffuse toward each other to attain energy transfer. Such a covalently bound PAG/sensitizer, however, would be extremely sensitive to the radiation absorbed by the sensitizer, i.e., would be chemically unstable with respect to the radiation. It is further possible for the PAG and/or sensitizer to be bound to the matrix, the photomonomer, and/or the expansion agent. Advantageously, the PAG and any sensitizer are compatible with other components of the material, as discussed above. Examples of suitable PAGs include cationic photoinitiators such as a sulfonium salt or an iodonium salt. In particular, alkoxyphenyl phenyliodonium salts, such as p-octyloxyphenyl phenyliodonium hexafluoroantimonate, have been found to be useful. These salts absorb predominantly in the UV portion of the spectrum, and are therefore typically sensitized to allow use of the visible portion of the spectrum. Rubrene is a useful sensitizer for use with such PAGs, and absorbs primarily in the visible light range in which holographic recording is typically performed. An example of an alternative visible cationic photoinitiator is ($\eta_5$-2,4-cyclopentadien-1-yl) ($\eta_6$-isopropylbenzene)-iron (II) hexafluorophosphate, available commercially from Ciba as Irgacure 261.

Where the photoactive monomer is not polymerized by acid catalysis, a variety of photoinitiators known to those skilled in the art and available commercially are suitable for polymerization. To avoid the need for sensitizers, it is advantageous to use a photoinitiator that is sensitive to light in the visible part of the spectrum, particularly at wavelengths available from conventional laser sources, e.g., the blue and green lines of Ar$^+$ (458, 488, 514 nm) and He—Cd lasers (442 nm), the green line of frequency doubled YAG lasers (532 nm), and the red lines of He—Ne (633 nm) and Kr$^+$ lasers (647 and 676 nm). One advantageous free radical photoinitiator is bis($\eta$-5-2,4-cyclopentadien-1-yl)bis[2,6-difluoro-3-(1H-pyrrol-1-yl)phenyl]titanium, available commercially from Ciba as CGI-784. Another visible free-radical photoinitiator (which requires a co-initiator) is 5,7, diiodo-3-butoxy-6-fluorone, commercially available from Spectra Group Limited as H-Nu 470. Free-radical photoinitiators consisting of dye-hydrogen donor systems are also possible. Examples of suitable dyes include eosin, rose bengal, erythrosine, and methylene blue, and suitable hydrogen donors include tertiary amines such as n-methyl diethanol amine.

The expansion agent is a compound capable of being induced to cleave by a mechanism such as acid or base catalysis, and which, typically, generates an acid or a base concomitant with or subsequent to cleavage, to allow the cleavage mechanism to continue. In the case of an acid-labile expansion agent, the fragmentation is typically a heterolytic bond cleavage that produces a cationic intermediate and a compound that contains an —OH group. The cationic intermediate undergoes further reaction, such as dissociation of a proton, to form a neutral product, e.g., an olefin. Many such fragmentation reactions are defined as deprotection reactions in the art of protection-deprotection reactions, such as reflected in T. W. Greene and P. G. M. Wuts, *Protective Groups in Organic Synthesis*, John Wiley & Sons, 1991, the disclosure of which is hereby incorporated by reference.

Advantageously, the agent is an acid-labile ester, which cleaves by acid catalysis, e.g., such as in Reaction I, below, in which the cationic intermediate is not shown. The acid-labile ester contains at least one acid-derived moiety, where the corresponding acid would include the —OH functional group discussed above (the acid-derived moiety designated by the bracketed moiety 1 in reaction I) such as a carboxylate, phosphonate, or phosphate, and at least one cleaving moiety (bracketed moiety 2 in reaction I) attached to a site (e.g., the oxygen atom in reaction I) that would be occupied by a proton in the acid from which the ester is derived. It is believed that the cleavage proceeds when a proton or other acidic catalyst renders the cleaving bond kinetically unstable, such that a product acid and the cationic intermediate are produced. It is possible for the acid catalyst to come from a variety of sources, e.g., an H$^+$ from a PAG, an H$^+$ from the cationic intermediate of the cleavage reaction, or a carbocationic or other electron-deficient product of the phototransformation of the PAG or sensitizer, such as a phenyl, substituted phenyl, or other aromatic cation.

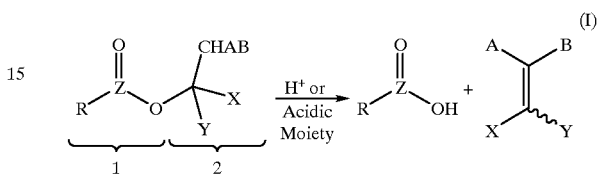

R is typically selected from hydrogen, alkyl, cycloalkyl, aryl, alkenyl, alkynyl, heteroaryl, with substituents such as halo, cyano, acyl, and alkoxy included according to the considerations below and advantageously subject to making thermally stable compounds, e.g., stable at temperatures of at least 40° C., advantageously at least 70° C. X and Y are the same or different and are typically selected from hydrogen, alkyl, cycloalkyl, alkenyl, alkynyl, aryl, and heteroaryl, with substituents also chosen according to the considerations below. A and B are the same or different and are typically selected from hydrogen, alkyl, cycloalkyl, aryl, heteroaryl, alkenyl, alkynyl, and acyl, with substituents such as halo, cyano, and alkoxy, chosen according to the considerations below. Z is typically selected from carbon, sulfur, S=O, or E-P, where the P is attached to the R, O, and cleaving moiety and where E is selected from alkoxy, aryloxy, alkyl, cycloalkyl, aryl, alkenyl, alkynyl, and heteroaryl, with substituents such as halo, cyano, and nitro. Where Z is E-P, it is possible for R to also be alkoxy or aryloxy. While moiety 1 in reaction I is typical of an acid structure, it is also possible to use other types of structures, e.g., dinitrophenols, as the basis for the acid functionality. (It is contemplated that the case where R is H and Z is C=O (formate ester) will lead to a usable cleavage chemistry and an acidic fragment, formic acid, with a pK$_a$ in a usable range. However, the formic acid is undesirably small, which leads to grating instability in holographic media, and its esters are typically inconvenient to prepare.)

Techniques for controlling the rate of such a reaction, e.g., by altering the acidity of the acid and/or the stability of the cation intermediate through selection of particular substituents, are presented in the open literature of physical organic chemistry. (See, e.g., T. H. Lowry and K. S. Richardson, *Mechanism and Theory in Organic Chemistry*, 2nd Ed., Harper & Row, 1981, the disclosure of which is hereby incorporated by reference.) Accessible fragmentation rates for the above embodiment range from far less than to far more than typical rates of acid-catalyzed polymerizations (which typically range from 0.2 to 10$^{-4}$ sec$^{-1}$), such that it is possible to attain a match of fragmentation rate to a given polymerization. The rate is typically able to be accelerated by incorporating at positions X and Y substituents that stabilize the cation intermediate, such substituents referred to in the art as electron donating substituents. Examples include methoxyphenyl and thienyl. It is possible to slow the rate of cleavage by use of electron withdrawing substituents at X and Y, such as trifluoromethyl, cyano, and nitro, which destabilize the cationic intermediate. In addition, incorporation of an unsaturated moiety at X and/or Y that becomes conjugated to the atom from which the product acid is cleaved typically results in acceleration of cleavage due to resonance stabilization, provided the unsaturated moiety is not severely electron withdrawing (e.g., not more strongly electron withdrawing than nitrophenyl, in terms of, for example, the Hammett constant ($\sigma^+$)). Incorporation of an alkyl group at positions X and/or Y typically results in acceleration due to inductive stabilization, provided the alkyl is not strongly electron withdrawing. Further effects of such substituents will be apparent to one skilled in the art, as reflected for example in T. H. Lowry and K. S. Richardson, *Mechanism and Theory in Organic Chemistry*, supra.

It is also possible to accelerate the rate of cleavage by lowering the $pK_a$ of the cleaved acid fragment. One way is which this is done is by attaching electron withdrawing groups to the acid-derived moiety, e.g., at position R of the above represented acid-labile ester, so that the induction or resonance effects of the groups are operative. It is also possible to attain this effect by replacing a weaker acid moiety of the expansion agent with a stronger acid moiety, e.g., replacing a carboxylic acid moiety with a lower $pK_a$ acid moiety such as a phosphonic acid moiety. In contrast to the invention's tunability, ring-opening polymerizations of spiro compounds, as discussed previously, in addition to their questionable ability to compensate for shrinkage, are difficult to tune to desired rates. In particular, the reactivity of the quaternary carbon center, at which ring-opening occurs, is not effectively tunable by substituents capable of being readily attached to the molecule.

The expanding agent and fragments thereof are advantageously non-interfering with the other components of the article of the invention. For example, where the photoactive monomer is an epoxide, the expanding agent and fragments thereof should not deactivate more than 50%, advantageously not more than 33%, of the propagating epoxide reactive intermediates. Similarly, where polymerization occurs by a free radical mechanism, the expanding agent and fragments thereof should not trap more than 50%, advantageously not more than 33%, of the radical intermediates. The expanding agent and fragments thereof also should not quench the photogenerated catalyst, e.g., for process using a PAG, the agent and fragments thereof should not be basic enough to stop the acid catalysis.

It is possible for the expanding agent and fragments thereof to participate in polymerization, as long as the shrinkage and expansion due to polymerization and cleavage, respectively, proceed at acceptable rates. For example, it is possible for an acid to add to an epoxy chain to result in chain transfer, as long as the chain transfer does not unacceptably interfere with polymerization. (Chain transfer indicates that the polymerization of the photoactive monomer is interrupted by addition of an acid fragment to the end of the polymerizing chain, and another chain is initiated, as discussed, for example, in G. Odian, *Principles of Polymerization,* 3d Ed., John Wiley & Sons, 1991.) To the extent that an acid fragment, e.g., from a PAG or from cleavage, causes chain transfer where the acid is polyfunctional (i.e., contains more than one ester group), the polyfunctional nature allows further growth of the chain backbone by linking chains together. This linking provides a polymer backbone having an overall length adequate for the intended use, e.g., formation of a stable hologram. Without such polyfunctionality, it is possible that the polymer chains formed from the photoactive monomer will be undesirably small, such as when the degree of chain transfer is high, e.g., greater than 33% of the monomer functional groups do not become linked to other monomer functional groups. Such small chains typically have a detrimental effect on the magnitude and stability of the refractive index contrast relied upon in forming a useful hologram due to undesired diffusion of the small chains. Inclusion of polyfunctional monomer is similarly advantageous, in that the effect of chain transfer on polymerization will typically be reduced since the polyfunctionality allows growth of the chain in more than one direction. It is also possible for the fragments of the agent to catalyze further polymerization or cleavage.

It is also contemplated that cleavage is capable of proceeding by catalysis other than acid catalysis. For example, it is contemplated that base catalysis will proceed according to the following elimination reaction:

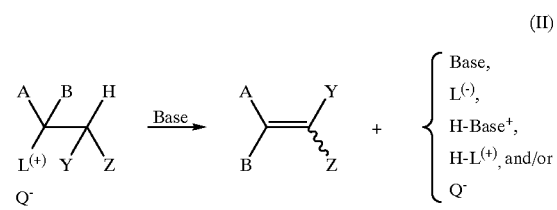

(II)

A and B are typically selected from H, alkyl, cycloalkyl, alkenyl, alkynyl, aryl, acyl, and heteroaryl. At least one of Y and Z, generally both, are selected from electron-withdrawing groups such as cyano, sulfonyl, acyl, and nitro, or unsaturated groups containing such electron-withdrawing substituents. The substituents Y and Z are selected such that the proton shown is acidic enough to be partly removed by the base and L, and is more acidic than A or B where A or B is H. The base and L are selected such that the base and the equilibrium mixture of partially protonated base and L are capable of catalyzing the elimination reaction, i.e., conditions are sufficiently basic for deprotonation of the expansion agent to occur at an acceptable rate. In one contemplated embodiment, the base is an organic amine and L is a tertiary organic amine or a phenoxide derivative. $Q^-$ is selected to be a non-interfering counter-ion, such as $BF_4^-$ or $CF_3SO_3^-$. Methods for photogenerating base are reflected, for example, in J. M. J. Frechet et al., "Photogenerated Base in Resist and Imaging Materials: Design of Functional Polymers Susceptible to Base Catalyzed Decarboxylation, *Chem. Mater.*, Vol. 9, 1997, 2887–2893; and E. J. Urankar and J. M. J. Frechet, "Photogenerated Base in Polymer Curing and Imaging: Cross-Linking of Base-Sensitive Polymers Containing Enolizable Pendant Groups," *Chem. Mater., Vol.* 9, 1997, 2861–2868, the disclosures of which are hereby incorporated by reference. Base-catalyzed elimination reactions are discussed, for example, in J. M. Halberd and L. Feeder, "Base-Catalyzed β-Elimination Reactions. 7. Elimination from 4-(Para-substituted-phenoxy)-2-oxobutanoic Acids," *J. Org. Chem.*, Vol. 43, No. 3, 1978, 452–459; and J. R. Keefe and W. P. Jencks, "Elimination Reactions of N-(2-(p-Nitrophenyl) ethyl)alkylammonium Ions by an E1cB Mechanism," *J. Am. Chem. Soc.*, Vol. 105, 1983, 265–279, the disclosures of which are hereby incorporated by reference. Free radical initiated cleavage reactions are also contemplated, as reflected in T. E. Boothe et al., "Stereochemistry of Free-Radical Eliminations on β-phenylsulfonyl radicals," *J. Org. Chem.*, Vol. 45, 1980, 794–797.

It is possible for the expansion agent to be monomeric or oligomeric, or for the agent to be attached to the polymeric matrix of the recording material or to the photoactive monomer. Attachment of the expansion agent to the matrix or monomer reduces the number of small fragments in the material (since one component of the agent remains bonded to the matrix or monomer or photopolymer). Similarly, it is possible for the expansion agent itself to be a relatively large, dendritic molecule, such that the cleaved fragments are relatively large. The expansion agent is also capable of being a mixture of various compounds, e.g., having varying degrees of functionality. It is possible for portions of the agent to be unbonded to the matrix or monomer, while other portions are bonded to the matrix or monomer. As discussed above, selection of an expansion agent includes considerations such as compatibility of the agent with the other components, and, in the case of a recording medium, substantial noninterference with the hologram writing chemistry.

The expansion agent is added in an amount suitable to provide, typically, about 0.4 vol. %, advantageously about 0.2 vol. %, shrinkage or less per molar concentration of polymerized monomer functional groups in the material. The volume expansion per molar concentration of cleaving moiety typically ranges from 1 to 3 vol. %, compared to the original volume of the material. Typically, the shrinkage-compensated material contains about 0.25 to about 2 moles of cleaving moieties per mole of monomer functional groups.

The amount of expansion agent needed is typically determined by density tables or direct measurement. For example, it is possible to compare the density of an expanding agent versus the densities of fragments that result from cleavage of the agent, either by experimental determination or looking to published tables. (Densities should be for liquid or amorphous phase, to avoid the contribution of crystal-to-melt expansion when crystalline solids are mixed in liquid or amorphous media.) Similarly, it is possible to obtain densities of monomers versus polymers from tables or by measurement (again, liquid or amorphous phase only). The dimensional changes expected from the polymerization of the monomer and the cleavage of the expansion agent are thereby capable of being estimated. Materials are advantageously chosen such that one bond formed (by polymerization) is approximately compensated by one bond cleaved (in the expansion agent). The anticipated effects of the cleavage/expansion on the degree of polymerization and changes in the aggregation of the monomers and/or cleaving moieties to each other or with other components should also be considered. It is possible to select or adjust the expansion agent to vary the expansion per volume fraction. For example, a lower molecular weight expansion agent will generally provide more expansion for a given volume fraction because of an increased concentration of cleaving moieties in the material, and a larger molecular weight expansion agent will generally provide less expansion because of the resultant lower concentration of cleaving moieties. In addition, hydrogen bonding either between fragments to be cleaved and already-cleaved fragments or between already-cleaved fragments generally provides less expansion because the hydrogen bonding causes a partial re-contraction.

Advantageously, the polymerization of the photoactive monomer or oligomer occurs with the same time period (i.e., interval) as the cleavage of the expansion agent—the polymerization and cleavage are event matched. For example, irradiation to induce polymerization advantageously also induces cleavage in the irradiated areas. Event matching is particularly desirable in formation of holograms. Otherwise, the shrinkage induced by each consecutive hologram would affect every prior-recorded hologram, and the cumulative shrinkage would affect each prior-recorded hologram, in a nonidentical manner, such that a subsequent step of cleavage/expansion would not be able to individually compensate for each hologram's shrinkage contribution. Event matching, by contrast, provides shrinkage compensation for each hologram, such that the properties of the overall medium are improved. For other, less demanding applications of the invention, a separate, subsequent shrinkage compensation step is typically more acceptable.

It is possible that each consecutive polymerization reaction will not occur at a rate on the same order of magnitude as each consecutive cleavage, i.e., the polymerization and cleavage will not be rate matched. It is advantageous, however, to attain rate matching—where polymerization and cleavage rates are of the same order of magnitude. Rate matching is desirable to maintain near-zero shrinkage/expansion in the material throughout the reaction. Rate matching thereby provides for introduction of relatively low stress in a material, fills confined spaces in the material, tends to reduce birefringence, and also tends to reduce distortion in holographic media.

In a recording medium according to the invention, it has been found useful to utilize an epoxide photoactive monomer in a methacrylate or siloxane matrix, with an alkoxyphenyl phenyliodonium salt PAG, e.g., p-octyloxyphenyl phenyliodonium hexafluoroantimonate, and rubrene as a sensitizer to visible light. Particular epoxide monomers useful in the invention include cyclohexene oxide, cyclopentene oxide, 4-vinylcyclohexene oxide and derivatives such as silylethyl derivatives capable of being prepared from 4-vinylcyclohexene oxide, 4-alkoxymethylcyclohexene oxides and acyloxymethylcyclohexene oxides capable of being prepared from 4-hydroxymethylcyclohexenes, and polyfunctional epoxides such as 3,4-epoxycyclohexylmethyl, 3,4-epoxycyclohexanecarboxylate, and 1,3-bis(2-(3,4-epoxycyclohexyl)ethyl)-1,1,3,3-tetramethydisiloxane (the latter referred to as diepoxy disiloxane in the examples). Epoxides including other substituents or higher functionality are also contemplated. As reflected in the Examples below, an expansion agent useful with these particular monomers, matrices, PAGs, and sensitizer is 1,1-diphenylethyl furan-2-carboxylate:

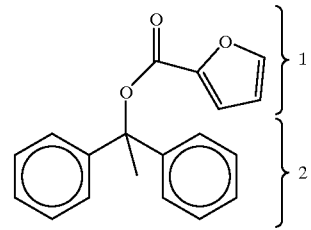

(Groups 1 and 2 shown in this agent correspond to groups 1 (acid moiety) and 2 (ester moiety) as shown in Reaction I, above.) Addition of one or more substituents to this molecule, in accordance with the guidelines discussed herein, would allow one to attain a desired rate relationship between epoxy polymerization and cleavage. The resulting acid fragment of this molecule does not appear to unduly inhibit the epoxy reaction—chain transfer appears to occur at an acceptably low level. Also, the resulting olefin fragment appears to offer low interference with the hologram writing process in the epoxy-based system. Compounds having these characteristics with respect to the particular photoactive monomer are expected to be similarly useful as expansion agents according to the invention. In addition, with use of an epoxide monomer, the acid fragment resulting from cleavage of the expansion agent advantageously has a $pK_a$ less than 4. Acids with $pK_a$ values of 4 or higher tend to cause too much chain transfer or termination, leading to insufficient epoxy polymerization.

In addition to the above considerations, it is advantageous to select materials for a recording medium that provide a high refractive index contrast, Δn, between the matrix polymer and the photopolymer. Such contrast is desirable to increase the strength of recorded holograms and/or write an increased number of holograms. It is advantageous to choose indexes of the matrix, monomer, and expander such that species of relatively higher index diffuse to an exposed or non-exposed region, leaving low index species in the other region.

A recording medium according to the invention is formed by adequately supporting the recording material (i.e., the matrix, monomer, expansion agent, photoinitiator system, and other additives), such that holographic writing and reading is possible. Typically, fabrication of the medium involves depositing the recording material between two plates using, for example, a gasket to contain the mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. The recording material is also capable of being supported in other ways. For instance, it is contemplated to dispose the matrix precursor/photoimageable system mixture into the pores of a substrate, e.g., a nanoporous glass material such as Vycor, prior to matrix cure. A stratified medium is also contemplated, i.e., a medium containing multiple substrates, e.g., glass, with layers of recording material disposed between the substrates. The medium of the invention is then capable of being used in a holographic system such as discussed previously.

In addition to a recording medium, it will be apparent to those skilled in the art from the principles discussed herein that the invention relates to a variety of polymeric articles in which shrinkage is desirably limited. Contemplated applications include optics, e.g., diffractive and refractive optics, polymer waveguides, and other precision applications.

The invention will be further clarified by the following examples, which are intended to be exemplary.

EXAMPLE 1

A mixture of equal weights cyclohexene oxide and 1,1-diphenylethyl furan-2-carboxylate (hereafter referred to as the expanding agent), with 10 wt. % p-octyloxyphenyl phenyliodonium hexafluoroantimonate (PAG), based on the weight of the entire mixture, was placed into a quartz tube and irradiated, at room temperature, with a conventional shortwave ultraviolet mineral lamp. After 1 hour a sample was evaluated by NMR and it was observed that 45 mole % of the cyclohexene oxide had polymerized and 5 mole % of the expanding agent had been cleaved. After 18 hours of irradiation, NMR showed that 98% of both the cyclohexene oxide and expanding agent had reacted. At 1 hour, the change in volume, as measured by the shrinkage in the tube, was about 1 vol. %, while the change in volume at 18 hours was between 0 and 1 vol. %. (Without any compensation, a change in volume of greater than 2 vol. % would have been expected.) While the rates of the polymerization and cleavage appeared to be different, the nearly complete polymerization and cleavage resulted in near zero net dimensional change.

(The 1,1-diphenylethyl furan-2-carboxylate was formed as follows. A solution of 5.8 g (29 mmole) of 1,1-diphenylethanol in 100 mL of THF was treated at room temperature with 1 equiv of BuLi. After 2 hours, when the exothermic reaction had subsided, a slight deficiency (27 mmol,2.7 mL) of furoyl chloride was added with ice bath cooling. After stirring overnight at room temperature, the products were partitioned between ether and aqueous $NaHCO_3$, and the ether layer was dried and concentrated, producing a solid consisting of 87 wt. % product and 13% unreacted alcohol, as indicated by NMR.)

EXAMPLE 2

Figure 2A:
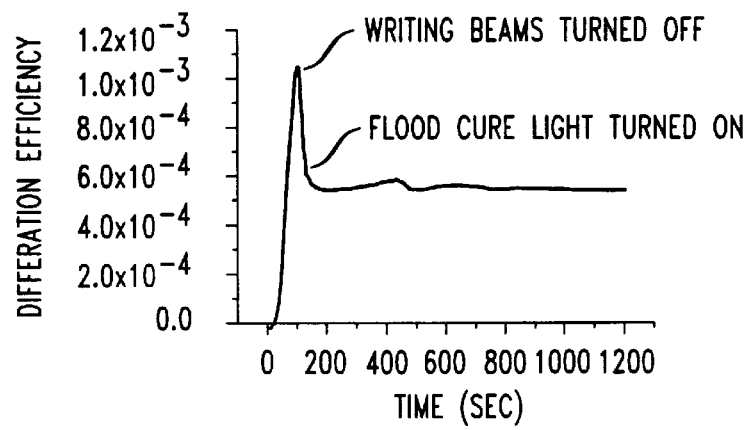
FIGS. 2A and 2B show the diffraction efficiency rise and Bragg peak, respectively, of a hologram formed in a recording medium of the invention.
Figure 2B:
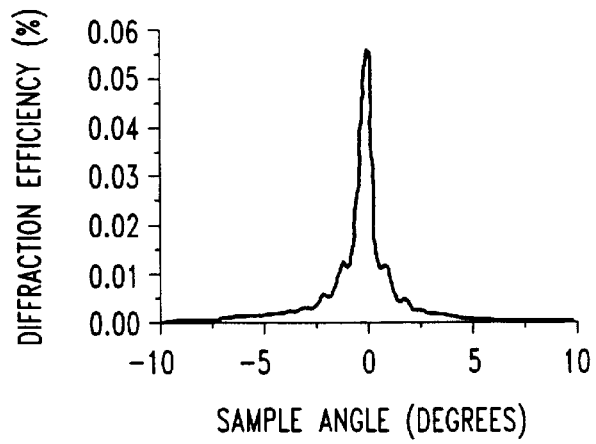

A holographic medium was prepared as follows. A mixture was formed from 2.0 g of 2000 molecular weight, extended epoxy silane containing 10 wt. % residual benzene, 0.50 g diepoxy disiloxane containing 15 wt. % p-octyloxyphenyl phenyliodonium hexafluoroantimonate (PAG), and 0.55 g of a 70/30 weight ratio mixture of 1,1-diphenylethyl furan-2-carboxylate and cyclohexene oxide. The mixture was placed between glass slides, using Teflon spacers to maintain a nominal 0.1 mm sample thickness. A plane wave hologram was written, at room temperature, into the medium as follows. The recording laser source was a frequency-doubled diode-pumped Nd:YAG system. The 532 nm output was divided between two arms in which the beams were spatially filtered and collimated to generate plane waves. The beams from each arm were spatially overlapped at the sample and intersected at an angle of 44° (in air). The sample was aligned such that the normal to the sample substrate bisected the two interfering beams. The light was vertically polarized at the sample. The spot diameters at the sample were 4 mm and the power in each arm was 2 mW. The kinetics of the grating formation was monitored by diffracting the 633 nm output of a He—Ne laser off of the grating during the writing period. A well formed, stable grating was obtained having a diffraction efficiency of 0.1%. The diffraction efficiency rise and Bragg peak of the grating are shown in FIGS. 2A and 2B, respectively.

(The extended epoxy silane was formed as follows. A solution was prepared of 40 mL benzene, 6.8 g 1,4-bis (dimethylsilyl)benzene, 2.0 g 4-vinyl-1,2-epoxycyclohexane, and 10 drops of platinum divinyltetramethylsiloxane catalyst in xylene (obtained from Gelest). The solution was stirred and heated at reflux for 20 minutes, cooled to room temperature, and mixed with 40 g diphenylsiloxane:vinylmethylsiloxane 3:1 copolymer (obtained from Gelest) and 30 more drops of the platinum catalyst. The mixture was heated 30 minutes at reflux and recooled, treated with charcoal, and filtered through celite with benzene rinsing of the filter medium. The benzene was removed under vacuum prior to use of the silane.)

Other embodiments of the invention will be apparent to those skilled in the art from consideration of the specification and practice of the invention disclosed herein.

What is claimed is:

1. An article comprising a material that comprises:
   a photoactive monomer capable of polymerization;
   an expansion agent comprising a cleaving moiety capable of being detached from the agent by a catalytic reaction; and
   one or more photoinitiators separate from the photoactive monomer and expansion agent or bound to the photoactive monomer or to both the photoactive monomer and expansion agent, where the one or more photoinitiators, upon irradiation by light, are capable of inducing polymerization of the monomer and detachment of the cleaving moiety, wherein upon the irradiation by light at a temperature of 40° C. or less, the material experiences no more than 0.2% volume shrinkage per molar concentration of polymerized monomer functional groups.

2. The article of claim 1, wherein the expansion agent comprises an acid-labile moiety.

3. The article of claim 2, wherein the expansion agent comprises an acid-labile ester, such that cleavage of the agent results in an acid and a substituted alkene.

4. The article of claim 2, wherein at least one of the one or more photoinitiators comprises a photoacid generator.

5. The article of claim 4, wherein the material further comprises a sensitizer for inducing the photoacid generator to generate acid in response to light having a wavelength ranging from 480 to 700 nm.

6. The article of claim 1, wherein the photoactive monomer is an epoxide.

7. The article of claim 6, wherein the expansion agent comprises an acid-labile moiety in which the acid fragment has a $pK_a$ value less than 4.

8. The article of claim 6, wherein the epoxide monomer is at least one of cyclohexene oxide; cyclopentene oxide; 4-vinylcyclohexene oxide; silylethyl derivatives prepared from 4-vinylcyclohexene oxide; 4-alkoxymethylcyclohexene oxides and acyloxymethylcyclohexene oxides prepared from 4-hydroxymethylcyclohexenes; 3,4-epoxycyclohexylmethyl 3,4-epoxycyclohexanecarboxylate; and 1,3-bis(2-(3,4-epoxycyclohexyl)ethyl)-1,1,3,3-tetramethydisiloxane.

9. A recording medium comprising a material that comprises:

a polymeric matrix;

a photoactive monomer;

an expansion agent comprising a cleaving moiety capable of being detached from the agent by a catalytic reaction; and one or more photoinitiators separate from the photoactive monomer and expansion agent or bound to the photoactive monomer or to both the photoactive monomer and expansion agent, where the one or more photoinitiators, upon irradiation by light, are capable of inducing polymerization of the monomer and detachment of the cleaving moiety, wherein upon the irradiation by light at a temperature of 40° C. or less, the material experiences no more than 0.2% volume shrinkage per molar concentration of polymerized monomer functional groups.

10. The recording medium of claim 9, wherein the expansion agent comprises an acid-labile moiety.

11. The recording medium of claim 10, wherein the expansion agent comprises an acid-labile ester, such that cleavage of the agent results in an acid and a substituted alkene.

12. The recording medium of claim 10, wherein at least one of the one or more photoinitiators comprises a photoacid generator.

13. The recording medium of claim 12, wherein the material further comprises a sensitizer for inducing the photoacid generator to generate acid in response to light in a wavelength range of 480 to 700 nm.

14. The recording medium of claim 9, wherein the photoactive monomer is an epoxide.

15. The recording medium of claim 14, wherein the expansion agent comprises an acid-labile moiety in which the acid fragment has a $pK_a$ value less than 4.

16. The recording medium of claim 14, wherein the epoxide monomer is at least one of cyclohexene oxide; cyclopentene oxide; 4-vinylcyclohexene oxide; silylethyl derivatives prepared from 4-vinylcyclohexene oxide; 4-alkoxymethylcyclohexene oxides and acyloxymethylcyclohexene oxides prepared from 4-hydroxymethylcyclohexenes; 3,4-epoxycyclohexylmethyl 3,4-epoxycyclohexanecarboxylate; and 1,3-bis(2-(3,4-epoxycyclohexyl)ethyl)-1,1,3,3-tetramethydisiloxane.

17. The recording medium of claim 9, wherein the expansion agent provides about 1 to about 3 volume percent expansion per molar concentration of cleaving moiety.

18. The recording medium of claim 9, wherein the expansion agent is present in an amount ranging from about 0.25 to about 2 moles cleaving moiety per mole of monomer functional groups.

* * * * *